United States Patent
Yamanishi et al.

(10) Patent No.: US 8,357,307 B2
(45) Date of Patent: Jan. 22, 2013

(54) METHOD OF FORMING ELECTRONIC CIRCUIT

(75) Inventors: Keisuke Yamanishi, Ibaraki (JP); Kengo Kaminaga, Ibaraki (JP); Ryo Fukuchi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 95 days.

(21) Appl. No.: 13/141,753

(22) PCT Filed: Dec. 22, 2009

(86) PCT No.: PCT/JP2009/071283
§ 371 (c)(1),
(2), (4) Date: Jun. 24, 2011

(87) PCT Pub. No.: WO2010/074054
PCT Pub. Date: Jul. 1, 2010

(65) Prior Publication Data
US 2011/0284496 A1 Nov. 24, 2011

(30) Foreign Application Priority Data
Dec. 26, 2008 (JP) .................................. 2008-334474

(51) Int. Cl.
*H01B 13/00* (2006.01)
(52) U.S. Cl. .......................................... 216/13; 216/20
(58) Field of Classification Search .................... 216/13, 216/20
See application file for complete search history.

(56) References Cited

U.S. PATENT DOCUMENTS

| | | |
|---|---|---|
| 2009/0162685 A1 | 6/2009 | Kobayashi et al. |
| 2010/0040873 A1 | 2/2010 | Kohiki et al. |
| 2010/0212941 A1 | 8/2010 | Higuchi |
| 2010/0261033 A1 | 10/2010 | Moriyama et al. |

FOREIGN PATENT DOCUMENTS

| | | |
|---|---|---|
| JP | 06-081172 A | 3/1994 |
| JP | 2002-176242 A | 6/2002 |
| JP | 2005-039097 A | 2/2005 |
| WO | 02/35897 A1 | 5/2002 |

*Primary Examiner* — Roberts Culbert
(74) *Attorney, Agent, or Firm* — Howson & Howson LLP

(57) ABSTRACT

Provided is a method of forming an electronic circuit, wherein a nickel or nickel alloy layer is formed on an etching side of a rolled copper foil or an electrolytic copper foil, the rolled copper foil or the electrolytic copper foil is bonded to a resin substrate to obtain a copper-clad laminate, a resist pattern for forming a circuit is subsequently applied on the copper foil, any unwanted portion of the copper foil and the nickel or nickel alloy layer of the copper-clad laminate other than the portion to which the resist pattern was applied is removed using an etching solution of an aqueous ferric chloride, the resist is further removed, and soft etching is additionally performed in order to remove the remnant nickel or nickel alloy layer and thereby form a circuit in which the space between copper circuit lines is of a width that is double or more from the thickness of copper. This invention aims to form a circuit with a uniform circuit width, improve the etching properties in pattern etching, and prevent the occurrence of short circuits and defects in the circuit width.

13 Claims, 1 Drawing Sheet

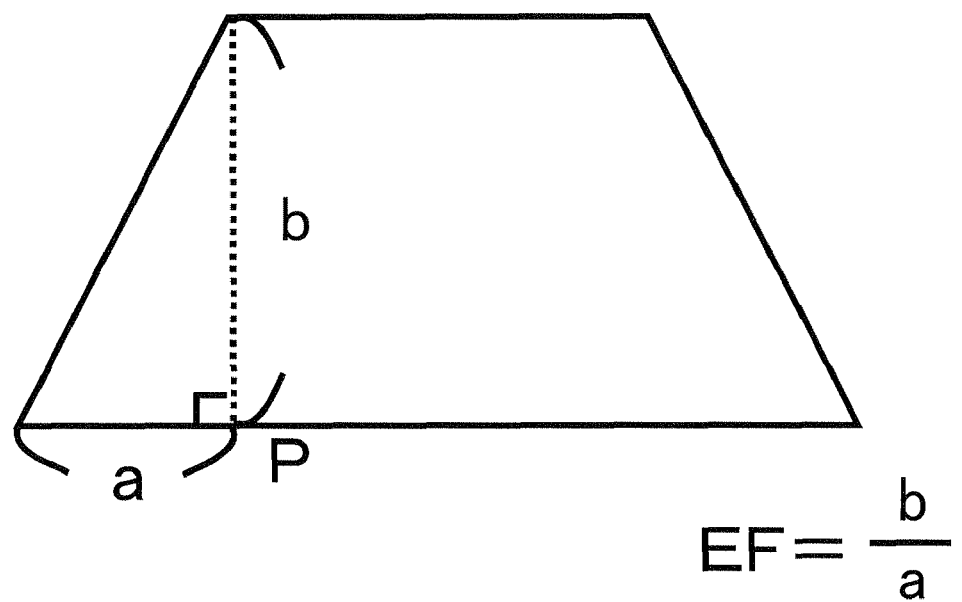
$$EF = \frac{b}{a}$$

METHOD OF FORMING ELECTRONIC CIRCUIT

BACKGROUND OF THE INVENTION

The present invention relates to a method of forming an electronic circuit by etching a rolled copper foil or an electrolytic copper foil to form a circuit.

A copper foil for a printed circuit is being widely used in electronic devices and electrical equipment. This kind of copper foil for a printed circuit is generally bonded to a base material such as a synthetic resin board or a film with an adhesive or without using an adhesive under high temperature and pressure to produce a copper-clad laminate, a circuit is subsequently printed with the process steps of resist coating and exposure in order to form the intended circuit, etching treatment is further performed in order to remove any unwanted part of the copper foil, and the various elements are soldered thereto in order to form a printed circuit for electronic devices.

A copper foil that is used for such a printed circuit can be broadly classified as an electrolytic copper foil and a rolled copper foil depending on the production method, but both are used according to the type or quality demand of the printed circuit board.

These copper foils have a surface that is bonded to a resin base material and a non-bonding surface, and they are respectively subject to special surface treatment (treatment process). In addition, there are cases where both surfaces are provided with a function of bonding with the resin (double treatment process); for instance, such as with a copper foil that is used as the inner layer of a multi-layered printed wiring board.

An electrolytic copper foil is generally produced by electrodepositing copper on a rotating drum, and continuously peeling this to obtain a copper foil. At this point in the production process, the surface in contact with the rotating drum is a gloss surface, and the opposite surface has numerous asperities (rough surface). Nevertheless, even with this kind of rough surface, it is standard to adhere copper particles of approximately 0.2 to 3 µm in order to further improve the adhesiveness with the resin substrate.

Moreover, there are also cases of reinforcing the foregoing asperities and forming a thin plated layer thereon for preventing the falling of the copper particles. The foregoing series of steps is referred to as roughening treatment. This kind of roughening treatment is required not only for electrolytic copper foils, but also required for rolled copper foils, and similar roughening treatment is also performed for rolled copper foils.

The foregoing copper foils are used and subject to hot pressing process or the Roll-to-Roll process to produce a copper-clad laminate. To cite hot pressing process as an example, this laminate is produced through the process steps of synthesizing epoxy resin, impregnating a paper base material with phenol resin and drying this to produce a prepreg, and subjecting the prepreg and the copper foil, which are combined, to heat pressure molding with a pressing machine. In addition to the above, there is a method of drying a polyimide precursor solution on the copper foil to solidify this onto the copper foil in order to form a polyimide resin layer on the copper foil.

With the copper-clad laminate produced as described above, a circuit is printed with the process steps of resist coating and exposure, and etching treatment is further performed to remove any unwanted part of the copper foil. However, when forming a circuit by etching, there is a problem in that the circuit does not have the intended circuit width.

This is because the copper portion of the copper foil circuit after etching is etched downward from the surface of the copper foil; that is, etched broader toward the resin layer (cause sagging). If large "sagging" occurs, the copper circuit will short in the vicinity of the resin substrate, and may become defective.

It is necessary to reduce such "sagging" as much as possible. Thus, in order to prevent defective etching such as etching broadened downward, attempts have been made to reduce the "sagging" by prolonging the etching time and increasing the etching process.

Nevertheless, in the foregoing case, if there is a portion that has already reached a predetermined width dimension, such portion will be additionally etched, and the circuit width of that copper foil portion will correspondingly become narrower, and the uniform line width (circuit width) that is intended in the circuit design cannot be obtained. In particular, there is a problem in that such portion (thinned portion) will generate heat and, in certain cases, become disconnected.

Under circumstances where the patterns of electronic circuits are becoming finer, problems caused by this kind of defective etching are still often encountered today, and are becoming major issues in forming circuits.

In order to overcome the foregoing problems, the present inventors proposed a copper foil in which a metal or alloy layer to be etched slower than copper was formed on the copper foil on the etching side (refer to Patent Document 1). As the metal or alloy in this case, used are nickel, cobalt and their alloys. Upon designing a circuit, since the etching solution will infiltrate from the resist coated side, namely, from the surface of the copper foil, if there is a metal or alloy layer with a slow etching rate immediately below the resist, the etching of the portion of the copper foil in the vicinity thereof is inhibited, and the etching of the other portions of the copper foil will advance. Thus, it was possible to yield the effect of reducing the "sagging" and fanning a circuit with a uniform line width. Consequently, there was a vast improvement in comparison to the conventional technology.

Here, some problems arose at the stage of making further improvements. Specifically, after forming the circuit, it was necessary to remove the resin and also necessary to remove the metal or alloy layer with a slow etching rate, which was formed for preventing the "sagging", by soft etching. In addition, there were cases where a layer composed of nickel or nickel alloy with a slow etching rate would remain undissolved during the process of forming an electronic circuit with the use of a copper foil having a metal or alloy layer (nickel or nickel alloy layer) with a slow etching rate as a copper-clad laminate.

Specifically, if a metal or alloy layer with a slow etching rate, with is formed for preventing "sagging", remains undissolved, the circuit will short (short circuit) especially if the circuit (space) is narrow, and problems such as deterioration in the migration characteristics occur. In particular, when forming a circuit in which the width between the copper circuit lines is not greater than double the copper thickness, a problem may occur even within the preferred scope of the invention previously proposed by the inventors. In order to shorten the time required for the etching and removal process and achieve a clean removal, it is necessary to make the thickness of the nickel of nickel alloy layer as thin as possible. There are problems in that defects such as short circuits in pattern etching or deterioration in the migration characteristics will occur. Thus, it is demanded that additional improvements be made, or different materials be used as a substitute therefore.

SUMMARY OF THE INVENTION

An object of this invention is to obtain a method of forming an electronic circuit using a rolled copper foil or electrolytic copper foil, wherein, upon forming a circuit by etching a copper foil of a copper-clad laminate, sagging caused by the etching is prevented, a uniform circuit having an intended circuit width can be formed, and the nickel layer is formed to have an appropriate thickness, and wherein the removal by soft etching can be facilitated, the treatment residue is prevented, the etching properties in pattern etching are improved, and the occurrence of short circuits and defects in the circuit width are prevented.

The present inventors discovered that several issues, such that it will be possible to form a circuit with a uniform circuit width without any sagging by forming a nickel layer on the etching surface of a rolled copper foil or an electrolytic copper foil and adjusting the etching rate in the thickness direction of the copper foil, and will be possible to facilitate the removal by soft etching as a result of making the coating layer on the copper surface to have an appropriate thinness, can be resolved simultaneously.

Based on the foregoing discovery, the present invention provides:
1. A method of forming an electronic circuit, the method of forming an electronic circuit by etching a copper-clad laminate, wherein a nickel or nickel alloy layer with a low etching rate is formed on an etching side of a copper layer formed of a rolled copper foil or an electrolytic copper foil, a surface of a non-etched side of the copper layer is thereafter bonded to a resin substrate to obtain a copper-clad laminate, a resist pattern for forming a circuit is subsequently applied on the side with the copper layer and the nickel or nickel alloy layer, any unwanted portion of the copper layer and the nickel or nickel alloy layer of the copper-clad laminate other than the portion to which the resist pattern was applied is removed using an etching solution of an aqueous ferric chloride, the resist is further removed, and soft etching is additionally performed in order to remove the remnant nickel layer and thereby form a circuit.

The present invention additionally provides:
2. The method of forming an electronic circuit according to 1 above, wherein formed is a circuit in which the ratio of the width between copper circuit lines relative to the thickness of copper is double or less if the thickness is 9 μm or more, or the ratio is 3.5 times or less if the thickness is less than 9 μm, and the etching factor is 2.0 or more.

The present invention further provides:
3. The method of forming an electronic circuit according to 1 or 2 above, wherein the nickel ratio in a nickel alloy layer as an alloy with a lower etching rate than the copper exceeds 50 wt %.
4. The method of forming an electronic circuit according to any one of 1 to 3 above, wherein the nickel amount is 100 μg/dm² to 3000 μg/dm².
5. The method of forming an electronic circuit according to any one of 1 to 4 above, wherein a chromium layer or a chromate layer and/or a silane-treated layer is additionally formed on the nickel or nickel alloy layer.

The present invention additionally provides:
6. The method of forming an electronic circuit according to 5 above, wherein the amount of chromium in the case of comprising the chromium layer or chromate layer is 100 μ/dm² or less based on metal chromium conversion.
7. The method of forming an electronic circuit according to 5 or 6 above, wherein the amount of silane in the case of forming the silane-treated layer is 20 μg/dm² or less based on silicon elemental conversion.

The present invention yields the effect of being able to form a uniform circuit having an intended circuit width upon forming a circuit by etching a copper foil of a copper-clad laminate. The present invention yields the additional effects of being able to prevent sagging caused by the etching, facilitate the removal by soft etching as a result of making the coating layer on the copper surface to have an appropriate thinness, and prevent the dissolution residue of the coating layer after etching. It is thereby possible to provide a method of forming a superior electronic circuit capable of improving the etching properties in pattern etching and preventing the occurrence of short circuits and defects in the circuit width.

BRIEF DESCRIPTION OF THE DRAWINGS

FIG. 1 A diagram explaining the outline of the calculation method of the etching factor (EF).

DETAILED DESCRIPTION OF THE INVENTION

The method of forming an electronic circuit according to the present invention is a method of forming an electronic circuit by etching a copper-clad laminate comprising a rolled copper foil or an electrolytic copper foil.

In order to achieve the object of the present invention, after forming a nickel or nickel alloy layer with a lower etching rate than copper on the etching side of a rolled copper foil or an electrolytic copper foil, the rolled copper foil or the electrolytic copper foil is bonded to a resin substrate to form a copper-clad laminate.

Subsequently, a resist pattern for forming a circuit is applied on the copper foil, and an etching solution is used to remove the copper foil of the copper-clad laminate other than the portion to which the resist pattern was applied. The steps from the formation of the resist pattern to the removal of unwanted copper foil are techniques that are generally being performed.

In the case of this invention, the unwanted portion of the nickel or nickel alloy layer on the copper foil is removed together with the copper foil portion with the etching solution. Here, as described above, the nickel or nickel alloy layer yields the effect of preventing the sagging of the copper circuit. Resist removal is subsequently performed, and the nickel or nickel alloy layer remaining on the resist is removed by soft etching. It is thereby possible to accurately form a circuit in which the etching factor is 2.0 or more. However, if the space is too narrow, a short circuit may occur in terms of accuracy of the formation of the circuit. Accordingly, in order to stably from a circuit, it is desirable that the ratio of the width between copper circuit lines relative to the thickness of copper is double or less if the thickness is 9 μm or more, or the ratio is 3.5 times or less if the thickness is less than 9 μm.

In case of an electrolytic copper foil, any of a roughened surface (M surface) and a gloss surface (S surface) is applicable, but the gloss surface side is usually etched. A rolled copper foil includes high-purity copper foils and copper alloy foils with improved strength, and the present invention covers all of these copper foils.

The nickel or nickel alloy which inhibits etching is positioned near the resist portion on the copper foil, and the etching rate of the copper foil on the resist side is restrained due to the nickel or nickel alloy layer, and conversely, the etching of copper proceeds at a normal rate with distance from the nickel or nickel alloy layer. Consequently, etching will proceed almost vertically from the resist side of the side surface of the copper circuit toward the resin substrate side, and a rectangular copper foil circuit is formed.

The primary objective of the nickel or nickel alloy layer is to prevent the occurrence of sagging so that a circuit with the intended uniform circuit width can be formed.

It is necessary to perform high-temperature treatment to the copper-clad laminate upon attaching the resin in the process of forming an electronic circuit. In the foregoing case, the nickel or nickel alloy layer is oxidized, and the resist coating properties (uniformity, adhesion) often deteriorate. Moreover, during the etching process, the interfacial oxide that is formed at the time of being heated often leads to variation in the etching, and causes a short circuit or non-uniformity of the circuit width. In the foregoing case, it is desirable to form a thick nickel or nickel alloy layer. Nevertheless, the nickel or nickel alloy layer may be formed thin if the copper-clad laminate will not be largely affected by heating.

As described above, although the influence caused by thermal oxidation can be prevented by forming a thick nickel or nickel alloy layer, the formation of a thick layer is not necessarily favorable. In other words, since it needs to be removed by way of soft etching after forming the circuit, much time will be required for the removal process. Upon forming a fine circuit, it is necessary to use an etching solution of an aqueous ferric chloride with a fast etching rate. This is due to the problem that the etching rate will deteriorate when a fine circuit is formed. An etching solution of an aqueous ferric chloride is an effective means for preventing such problems. It is thereby possible to accurately form a circuit in which the space between the copper circuit lines is double or less if the thickness is 9 μm or more, or the ratio is 3.5 times or less if the thickness is less than 9 μm.

A chromium layer or a chromate layer and/or a silane-treated layer may be additionally formed on the nickel or nickel alloy layer. Here, although there may be a difference in the etching rate relative to the pattern etching solution, as a result of adequately selecting their amounts, it is possible to inhibit the oxidation of the surface of the nickel or nickel alloy layer, and a pattern with a stable circuit width can thereby be formed.

Moreover, the amount of nickel contained in the nickel or nickel alloy layer is 100 μg/dm$^2$ to 3000 μg/dm$^2$, preferably 2250 μg/dm$^2$ or less, and more preferably 1500 μg/dm$^2$ or less. This is an amount that is required for inhibiting the occurrence of sagging during the etching of the circuit and etching a uniform circuit.

It will be ineffective if the amount is less than 100 μg/dm$^2$. Preferably, the amount is 200 μg/dm$^2$ or more, and more preferably 300 μg/dm$^2$ or more. In addition, the upper limit is set to 3000 μg/dm$^2$. If the amount is 100 μg/dm$^2$ or more, heat resistance (tarnish resistance) properties will arises, and it can be said that a greater thickness is favorable since the thickness heat resistance (tarnish resistance) properties will improve.

In the foregoing case, heat resistance (tarnish resistance) properties refer to the function of being able to inhibit the tarnish (discoloration) during storage, tarnish caused by heat during the soldering process, and tarnish caused by heat upon preparing a CCL substrate.

Meanwhile, if the amount is excessive, the burden of removing the nickel or nickel alloy layer during the soft etching will become significant, and in certain cases it will cause problems such as treatment residue and deterioration in the migration characteristics, and will impair the copper circuit design. Accordingly, the amount must be within the foregoing range.

Further, if the chromium layer or the chromate layer is to be provided in the rolled copper foil or electrolytic copper foil for an electronic circuit according to the present invention, the amount of chromium is set to be 100 μg/dm$^2$ or less based on metal chromium conversion. In addition, when forming the silane-treated layer, the amount of silane is preferably 20 μg/dm$^2$ or less based on silicon elemental conversion. This is in order to inhibit differences in the etching rate relative to the pattern etching solution. Nevertheless, an adequate amount is effective in preventing the thermal oxidation of the nickel or nickel alloy layer.

Examples of preferred plating conditions are shown below.
(Nickel Plating)
  Ni: 10 to 40 g/L
  pH: 2.5 to 3.5
  Temperature: Ordinary temperature to 60° C.
  Current density Dk: 2 to 50 A/dm$^2$
  Time: 1 to 4 seconds
(Nickel-Zinc Alloy Plating)
  Ni: 10 to 40 g/L
  Zn: 0.5 to 7 g/L
  $H_2SO_4$: 2 to 20 g/L
  Temperature: Ordinary temperature to 60° C.
  Current density Dk: 10 to 50 A/dm$^2$
  Time: 1 to 4 seconds
(Chromium Plating Conditions)
  $K_2Cr_2O_7$ ($Na_2Cr_2O_7$ or $CrO_3$)
  Cr: 40 to 300 g/liters
  $H_2SO_4$: 0.5 to 10.0 g/liters
  Bath temperature: 40 to 60° C.
  Current density Dk: 0.01 to 50 A/dm$^2$
  Time: 1 to 100 seconds
(Chromate Treatment Conditions)
  $K_2Cr_2O_7$ ($Na_2Cr_2O_7$ or $CrO_3$): 2 to 10 g/liters
  NaOH or KOH: 10 to 50 g/liters
  ZnO or $ZnSO_4 \cdot 7H_2O$: 0.05 to 10 g/liters
  pH: 2 to 13
  Bath temperature: 20 to 80° C.
  Current density $D_k$: 0.05 to 5 A/dm$^2$
  Time: 5 to 30 seconds
  Anode: Pt—Ti plate, stainless steel plate, etc.
(Silane Treatment Conditions)
  Silane is selected from the various systems shown below.
  Concentration: 0.01 wt % to 5 wt %
  Type: olefin-system silane, epoxy-system silane, acrylic-system silane, amino-system silane, mercapto-system silane
  Silane dissolved in alcohol is diluted with water up to a prescribed concentration, and applied to the copper foil surface.
(Method of Analyzing Amount of Nickel Adhesion)

In order to analyze the nickel-treated surface, the opposite surface is prepared with FR-4 resin by press work, and subsequently masked. A sample thereof is dissolved in nitric acid with a concentration of 30% until the surface treatment coating is dissolved, the solution inside the beaker is diluted tenfold, and the quantitative analysis of nickel is performed with atomic absorption spectrometry.
(Method of Analyzing Amount of Zinc and Chromium Adhesion)

In order to analyze the treated surface, the opposite surface is prepared with FR-4 resin by press work, and subsequently masked. A sample thereof is boiled for 3 minutes in hydrochloric acid with a concentration of 10% to dissolve the treated layer, and this solution is used to perform the quantitative analysis of zinc and chromium is performed with atomic absorption spectrometry.

(Consideration of Thermal Influence)

During the stage of producing the copper-clad laminate (CCL), the copper foil is exposed to heat. Due to this heat, the etching improvement treated layer provided to the copper foil surface will diffuse to the copper layer. Thus, the initially expected etching improvement effect will diminish, and the etching factor tends to decrease. In light of the above, in order to yield the same effect as a non-diffused state, it is necessary to increase the amount of adhesion of the improvement treated layer by 1.1 to 2 times in consideration of the heat quantity to which the copper foil is exposed during the production of the CCL.

(Measurement Conditions of Etching Factor)

In cases where etching is broadened downward (in cases where sagging occurs); if the intersection point of the perpendicular from the upper surface of the copper foil, on the assumption that the circuit was etched vertically, with the resin substrate is regarded as point P, and if the sagging length from the point P is regarded as distance "a", the etching factor shows the ratio (b/a) of the distance "a" to the thickness "b" of the copper foil. The larger the numerical value of the etching factor is, the greater the inclination angle will be. This means that etching residue will lessen and sagging will diminish.

The outline of the calculation method of the etching factor (EF) is shown in FIG. 1. As shown in FIG. 1, the calculation is performed as EF=b/a. As a result of using this etching factor, the quality of the etching properties can be easily determined.

EXAMPLES

The Examples and Comparative Examples of the present invention are now explained. Incidentally, these Examples are merely illustrative, and the present invention shall in no way be limited thereby. In other words, various modifications and other embodiments based on the technical spirit claimed in the claims shall be covered by the present invention as a matter of course.

Example 1

A rolled copper foil with a foil thickness of 18 µm was used. Under the foregoing nickel plating conditions, a nickel-plated layer with a nickel adhesion amount of 2500 µg/dm$^2$ as shown in Table 1 below was formed on the rolled copper foil. This was subsequently bonded to a resin substrate. Subsequently, a circuit with 10 lines was printed with the process steps of resist coating and exposure, and etching treatment was further performed to remove any unwanted part of the copper foil.

After forming the circuit by etching, the resist was removed, nickel was further removed by soft etching, and ultimately a circuit of only copper was formed.

The etching conditions, circuit forming conditions, the treatment residue in the circuit width direction, and soft etching properties (removal of nickel layer) were as follows.

(Etching Conditions)
 Aqueous ferric chloride: (37 wt %, Baume degree: 40°)
 Solution temperature: 50° C.
 Spray pressure: 0.15 MPa
(Circuit Forming Conditions)
 Circuit pitch: There are two types of circuit pitches; namely, a 30 µm pitch and a 50 µm pitch, and the circuit pitch is changed according to the thickness of the copper foil. In the case of Example 1, the following conditions were adopted since a copper foil with a thickness of 18 µm was used.

(Formation of a Circuit with 50 µm Pitch)
 Resist L/S=33 µm/17 µm; top (upper part) width of finished circuit: 15 µm; etching time: around 105 seconds
(Treatment Residue in the Circuit Width Direction)

The upper surface of the circuit was observed with an electron microscope, and the treatment residue of 2 µm or more in the circuit width direction was considered an inferior result (X), and the treatment residue of less than 2 µm was considered a favorable result (○).

(Soft Etching Removal Properties)

The circuit was immersed and agitated in a sulfuric acid-hydrogen peroxide mixed solution (165 g/L of sulfuric acid and 21 g/L of hydrogen peroxide) at 35° C. for 2 minutes, and the external appearance was observed to confirm whether the unwanted part has been removed.

Etching was performed under the foregoing conditions to form a circuit, and soft etching was performed after removing the resin.

The results are shown in Table 1. This is the evaluation result of a circuit with 10 lines. As shown in Table 1, the ratio of the space between the circuit lines and the foil thickness was 1.4. The treatment residue was minimal, the evaluation was favorable (○), and the soft etching properties were also favorable (○).

Example 2

A rolled copper foil was used in this Example, and this was subject to copper plating. The thickness of the rolled copper foil was 9 µm and the thickness of the copper plating was 9 µm, and the total foil thickness was 18 µm.

Under the foregoing nickel plating conditions, a nickel-plated layer with a nickel adhesion amount of 2000 µg/dm$^2$ as shown in Table 1 below was formed on the rolled copper foil. This was subsequently bonded to a resin substrate. Subsequently, a circuit with 10 lines was printed with the process steps of resist coating and exposure, and etching treatment was further performed to remove any unwanted part of the copper foil.

After forming the circuit by etching, the resist was removed, nickel was further removed by soft etching, and ultimately a circuit of only copper was formed.

The etching conditions and circuit forming conditions were the same as Example 1, and the treatment residue in the circuit width direction and soft etching properties (removal of nickel layer) were measured as with Example 1.

Etching was performed under the foregoing conditions to form a circuit, and soft etching was performed after removing the resin.

The results are also shown in Table 1. This is the evaluation result of a circuit with 10 lines. As shown in Table 1, the ratio of the space between the circuit lines and the foil thickness was 1.4. The treatment residue was minimal, the evaluation was favorable (○), and the soft etching properties were also favorable (○).

Example 3

A copper-plated substrate was used as the resin substrate (polyimide-system resin) was used in this Example. The thickness of the copper plating was 18 µm.

Under the foregoing nickel plating conditions, a nickel-plated layer with a nickel adhesion amount of 1000 µg/dm$^2$ as shown in Table 1 below was formed on the copper-plated substrate. Subsequently, a circuit with 10 lines was printed with the process steps of resist coating and exposure, and etching treatment was further performed to remove any unwanted part of the copper foil. After forming the circuit by etching, the resist was removed, nickel was further removed by soft etching, and ultimately a circuit of only copper was formed.

Excluding the circuit forming conditions, the etching conditions were the same as Example 1, and the treatment residue in the circuit width direction and soft etching properties (removal of nickel layer) were measured as with Example 1.

The circuit forming conditions were as follows: a circuit with 30 μm pitch; resist L/S=25 μm/5 μm; top (upper part) width of finished circuit: 10 μm; and etching time: around 76 seconds.

Etching was performed under the foregoing conditions to form a circuit, and soft etching was performed after removing the resin.

The results are also shown in Table 1. This is the evaluation result of a circuit with 10 lines. As shown in Table 1, the ratio of the space between the circuit lines and the foil thickness was 1.9. The treatment residue was minimal, the evaluation was favorable (○), and the soft etching properties were also favorable (○).

Example 4

An rolled copper foil was used in this Example. The thickness of the rolled copper foil was 8 μm. Under the foregoing nickel plating conditions, a nickel-plated layer with a nickel adhesion amount of 500 μg/dm$^2$ as shown in Table 1 below was formed on the glossy surface of the rolled copper foil. This was subsequently bonded to a resin substrate. Subsequently, a circuit with 10 lines was printed with the process steps of resist coating and exposure, and etching treatment was further performed to remove any unwanted part of the copper foil. After forming the circuit by etching, the resist was removed, nickel was further removed by soft etching, and ultimately a circuit of only copper was formed.

The etching conditions and circuit forming conditions were the same as Example 1, and the treatment residue in the circuit width direction and soft etching properties (removal of nickel layer) were measured as with Example 1.

Etching was performed under the foregoing conditions to form a circuit, and soft etching was performed after removing the resin.

The results are also shown in Table 1. This is the evaluation result of a circuit with 10 lines. As shown in Table 1, the ratio of the space between the circuit lines and the foil thickness was 3.4. The treatment residue was minimal, the evaluation was favorable (○), and the soft etching properties were also favorable (○).

Example 5

An electrolytic copper foil with a foil thickness of 5 μm was used. Under the foregoing nickel-zinc plating conditions, a nickel-zinc plated layer with a nickel adhesion amount of 2500 μg/dm$^2$ and a zinc adhesion amount of 650 μg/dm$^2$ as shown in Table 1 below was formed on the electrolytic copper foil. The nickel ratio was 66 wt%. This was subsequently bonded to a resin substrate. Subsequently, a circuit with 10 lines was printed with the process steps of resist coating and exposure, and etching treatment was further performed to remove any unwanted part of the copper foil. After forming the circuit by etching, the resist was removed, the nickel-zinc plated layer was further removed by soft etching, and ultimately a circuit of only copper was formed.

The etching conditions and circuit forming conditions were the same as Example 1, and the treatment residue in the circuit width direction and soft etching properties (removal of nickel-zinc plated layer) were measured as with Example 1.

Etching was performed under the foregoing conditions to form a circuit, and soft etching was performed after removing the resin.

The results are also shown in Table 1. This is the evaluation result of a circuit with 10 lines. As shown in Table 1, the ratio of the space between the circuit lines and the foil thickness was 1.4. The treatment residue was minimal, the evaluation was favorable (○), and the soft etching properties were also favorable (○).

Comparative Example 1

A rolled copper foil with a foil thickness of 18 μm was used. Under the foregoing nickel plating conditions, a nickel-plated layer with a nickel adhesion amount of 7500 μg/dm$^2$ as shown in Table 1 below was formed on the rolled copper foil. This was subsequently bonded to a resin substrate. Subsequently, a circuit with 10 lines was printed with the process steps of resist coating and exposure, and etching treatment was further performed to remove any unwanted part of the copper foil. After forming the circuit by etching, the resist was removed, the nickel-zinc plated layer was further removed by soft etching, and ultimately a circuit of only copper was formed. The etching conditions and circuit forming conditions were the same as Example 1, and the treatment residue in the circuit width direction and soft etching properties (removal of nickel layer) were measured as with Example 1.

Etching was performed under the foregoing conditions to form a circuit, and soft etching was performed after removing the resin.

The results are shown in Table 1. This is the evaluation result of a circuit with 10 lines. As shown in Table 1, the ratio of the space between the circuit lines and the foil thickness was 1.4, but the treatment residue increased, the evaluation was inferior (x), and the soft etching properties were also inferior (x). This is considered to be because the thickness of the nickel layer was too large.

Comparative Example 2

A rolled copper foil with a foil thickness of 18 μm was used. Under the foregoing nickel plating conditions, a nickel-plated layer with a nickel adhesion amount of 10000 μg/dm$^2$ as shown in Table 1 below was formed on the rolled copper foil. This was subsequently bonded to a resin substrate. Subsequently, a circuit with 10 lines was printed with the process steps of resist coating and exposure, and etching treatment was further performed to remove any unwanted part of the copper foil. After forming the circuit by etching, the resist was removed, the nickel-zinc plated layer was further removed by soft etching, and ultimately a circuit of only copper was formed. Excluding the circuit forming conditions, the etching conditions were the same as Example 1, and the treatment residue in the circuit width direction and soft etching properties (removal of nickel layer) were measured as with Example 1. The circuit forming conditions were as follows: a circuit with 30 μm pitch; resist L/S =25 μm/5 μm; top (upper part) width of finished circuit: 10 μm; and etching time: around 76 seconds.

Etching was performed under the foregoing conditions to form a circuit, and soft etching was performed after removing the resin.

The results are shown in Table 1. This is the evaluation result of a circuit with 10 lines. As shown in Table 1, the ratio of the space between the circuit lines and the foil thickness was 1.6, but the treatment residue increased, the evaluation was inferior (x), and the soft etching properties were also inferior (x). This is considered to be because the thickness of the nickel layer was too large.

Comparative Example 3

An electrolytic copper foil with a foil thickness of 5 μm was used. Under the foregoing nickel plating conditions, a nickel-plated layer with a nickel adhesion amount of 5000 μg/dm² as shown in Table 1 below was formed on the glossy surface of the electrolytic copper foil. This was subsequently bonded to a resin substrate. Subsequently, a circuit with 10 lines was printed with the process steps of resist coating and exposure, and etching treatment was further performed to remove any unwanted part of the copper foil.

After forming the circuit by etching, the resist was removed, nickel was further removed by soft etching, and ultimately a circuit of only copper was formed.

Excluding the circuit forming conditions, the etching conditions were the same as Example 1, and the treatment residue in the circuit width direction and soft etching properties (removal of nickel layer) were measured as with Example 1. The circuit forming conditions were as follows: a circuit with 30 μm pitch; resist L/S=25 μm/5 μm; top (upper part) width of finished circuit: 10 μm; and etching time: around 48 seconds.

Etching was performed under the foregoing conditions to form a circuit, and soft etching was performed after removing the resin.

The results are shown in Table 1. This is the evaluation result of a circuit with 10 lines. As shown in Table 1, the ratio of the space between the circuit lines and the foil thickness was 3.5. The treatment residue increased, the evaluation was inferior (x), and the soft etching properties were also inferior (x). This is considered to be because the thickness of the nickel layer was too large.

Comparative Example 4

A rolled copper foil with a foil thickness of 18 μm was used. This rolled copper foil was bonded to a resin substrate. Subsequently, a circuit with 10 lines was printed with the process steps of resist coating and exposure, and etching treatment was further performed to remove any unwanted part of the copper foil. The circuit forming conditions were as follows: a circuit with 30 μm pitch; resist L/S=25 μm/5 μm; top (upper part) width of finished circuit: 10 μm; and etching time: around 48 seconds.

A circuit was formed by etching, but the circuit had shorted and the ratio of the space between the circuit lines and the foil thickness was not calculable. The results are shown in Table 1. It has been discovered that it is difficult to form a copper circuit without the existence of a nickel layer.

Comparative Example 5

An electrolytic copper foil with a foil thickness of 5 μm was used. The rough surface of this electrolytic copper foil was bonded to a resin substrate. Subsequently, a circuit with 10 lines was printed on the glossy surface of the electrolytic copper foil with the process steps of resist coating and exposure, and etching treatment was further performed to remove any unwanted part of the copper foil.

The circuit forming conditions were as follows: a circuit with 30 μm pitch; resist L/S=25 μm/5 μm; top (upper part) width of finished circuit: 10 μm; and etching time: around 48 seconds.

A circuit was formed by etching, but the 50 μm pitch of EF was 1.4 and etching proceeded broader toward the end, and this was not a favorable situation. The ratio of the space between the circuit lines and the foil thickness was 2.6. The results are shown in Table 1. It has been discovered that, if there is no nickel layer, the cutting of the circuit is inferior and it is difficult to form a circuit even if the thickness of the copper is thin.

Comparative Example 6

A rolled copper foil with a foil thickness of 9 μm was used. This rolled copper foil was bonded to a resin substrate. Subsequently, a circuit with 10 lines was printed with the process steps of resist coating and exposure, and etching treatment was further performed to remove any unwanted part of the copper foil.

The circuit forming conditions were as follows: a circuit with 30 μm pitch; resist L/S=25 μm/5 μm; top (upper part) width of finished circuit: 10 μm; and etching time: around 48 seconds.

A circuit was formed by etching, but the 50 μm pitch of EF was 1.3 and etching proceeded broader toward the end, and this was not a favorable situation. The ratio of the space between the circuit lines and the foil thickness was 0.7. The results are shown in Table 1. It has been discovered that, if there is no nickel layer, the cutting of the circuit is inferior and it is difficult to form a circuit even if the thickness of the copper is thin.

Comparative Example 7

A rolled copper foil with a foil thickness of 18 μm was used. Under the foregoing conditions, a nickel-plated layer was formed on the rolled copper foil. The copper foil side was bonded to a resin substrate. Subsequently, a circuit with 10 lines was printed on the nickel-plated surface of the rolled copper foil with the process steps of resist coating and exposure, and etching treatment was further performed to remove any unwanted part of the nickel-plated copper foil. The circuit forming conditions were as follows: a circuit with 30 μm pitch; resist L/S=25 μm/5 μm; top (upper part) width of finished circuit: 10 μm; and etching time: around 48 seconds.

A circuit was formed by etching, but the 30 μm pitch of EF was 1.2 and etching proceeded broader toward the end, and this was not a favorable situation. The ratio of the space between the circuit lines and the foil thickness was 0.4. The results are shown in Table 1. It has been discovered that, even if there is a nickel layer, the cutting of the circuit is inferior and it is difficult to form a circuit if the Ni amount is low.

Comparative Example 8

An electrolytic copper foil with a foil thickness of 5 μm was used. Under the foregoing nickel-zinc plating conditions, a nickel-zinc alloy plated layer was formed on the glossy surface of the electrolytic copper foil. The Ni ratio of the nickel-zinc alloy plated layer was 30 wt%. The copper foil side was bonded to a resin substrate. Subsequently, a circuit with 10 lines was printed on the nickel-zinc alloy plated surface of the electrolytic copper foil with the process steps of resist coating and exposure, and etching treatment was further performed to remove any unwanted part of the nickel-zinc alloy plated copper foil.

The circuit forming conditions were as follows: a circuit with 30 μm pitch; resist L/S=25 μm/5 μm; top (upper part) width of finished circuit: 10 μm; and etching time: around 48 seconds.

A circuit was formed by etching, but the 30 μm pitch of EF was 1.4 and etching proceeded broader toward the end, and this was not a favorable situation. The ratio of the space between the circuit lines and the foil thickness was 54. The results are shown in Table 1. It has been discovered that, even if there is a nickel layer, the cutting of the circuit is inferior and it is difficult to form a circuit if the Ni ratio is small.

As evident from Table 1, when nickel with a lower etching rate than copper is formed on the etching side of the copper foil, it was able to form an approximately rectangular copper foil circuit with no or minimal treatment residue with the use of either the rolled copper foil or the electrolytic copper foil, and an extremely favorable etched circuit was obtained. Meanwhile, those that did not satisfy the conditions of the present invention caused considerable sagging, a trapezoidal copper foil circuit was formed, and this resulted in defective etching. In the Examples, although cases were explained of forming a nickel layer or a nickel-zinc layer, it has been confirmed that similar results are also achieved with other alloy layers containing nickel. Nevertheless, in comparison to alloy plating, an independent nickel-plated layer is easier to manage in terms of the plating solution and plating conditions.

The present invention yields the effect of being able to form a uniform circuit having an intended circuit width when forming a circuit by etching a copper foil, and yields the additional effects of being able to prevent the treatment residue after etching, prevent sagging, shorten the time of forming a circuit by etching, and make the thickness of the nickel or nickel alloy layer as thin as possible. Since it is thereby possible to improve the etching properties in pattern etching and to prevent the occurrence of short circuits and defects in the circuit width, the present invention can be used as a copper-clad laminate (rigid or flexible), and also used for forming an electronic circuit of a printed substrate.

The invention claimed is:

1. A method of forming an electronic circuit by etching a copper-clad laminate, wherein a nickel or nickel alloy layer with a low etching rate is formed on an etching side of a copper layer formed of a rolled copper foil or an electrolytic copper foil, a surface of a non-etched side of the copper layer is thereafter bonded to a resin substrate to obtain a copper-clad laminate, a resist pattern for forming a circuit is subsequently applied on the side with the copper layer and the nickel or nickel alloy layer, any unwanted portion of the copper layer and the nickel or nickel alloy layer of the copper-clad laminate other than a portion to which the resist pattern was applied is removed using an etching solution of an aqueous ferric chloride, the resist is further removed, and soft etching is additionally performed in order to remove the remnant nickel or nickel alloy layer and thereby form a circuit.

2. The method of forming an electronic circuit according to claim 1, wherein formed is a circuit in which the ratio of the width between copper circuit lines relative to the thickness of copper is double or less if the thickness is 9 μm or more, or the ratio is 3.5 times or less if the thickness is less than 9 μm, and the etching factor is 2.0 or more.

TABLE 1

|  | Base foil | Foil Thickness (μm) | Type of Plating | Treated Amount (Ni amount) (μg/dm$^2$) | Ni Ratio | EF 30 μm pitch | EF 50 μm pitch | Space/Foil Thickness Ratio | Treatment Residue | Soft Etching Properties |
|---|---|---|---|---|---|---|---|---|---|---|
| Example 1 | Rolled copper foil | 18 | A1 | 2500 | 100 |  | 3.5 | 1.4 | ○ | ○ |
| Example 2 | Rolled copper foil + Copper plating | 18 (9 + 9) | A1 | 2000 | 100 |  | 3.5 | 1.4 | ○ | ○ |
| Example 3 | Copper plating | 18 | A1 | 1000 | 100 | 3.2 |  | 1.9 | ○ | ○ |
| Example 4 | Rolled copper foil | 8 | A1 | 500 | 100 | 3.3 |  | 3.4 | ○ | ○ |
| Example 5 | Electrolytic copper foil | 5 | A2 | 2500 | 66 |  | 3.5 | 1.4 | ○ | ○ |
| Comparative Example 1 | Rolled copper foil | 18 | A1 | 7500 | 100 |  | 3.5 | 1.4 | X | X |
| Comparative Example 2 | Rolled copper foil | 18 | A1 | 10000 | 100 | 3.4 |  | 1.6 | X | X |
| Comparative Example 3 | Electrolytic copper foil | 5 | A1 | 5000 | 100 | 3.9 |  | 3.5 | X | X |
| Comparative Example 4 | Rolled copper foil | 18 | — | 0 |  |  | Short circuit | Not calculable | ○ | ○ |
| Comparative Example 5 | Electrolytic copper foil | 5 | — | 0 |  | 1.4 |  | 2.6 | ○ | ○ |
| Comparative Example 6 | Rolled copper foil | 9 | — | 0 |  | 1.3 |  | 0.7 | ○ | ○ |
| Comparative Example 7 | Rolled copper foil | 18 | A1 | 80 | 100 |  | 1.2 | 0.4 | ○ | ○ |
| Comparative Example 8 | Electrolytic copper foil | 5 | A2 | 300 | 30 |  | 1.4 | 54 | ○ | ○ |

EF: Etching Factor
Type of plating
A1 Nickel plating
A2 Nickel-zinc alloy plating 3. The method of forming an electronic circuit according to claim 2, wherein the nickel ratio in a nickel alloy layer as an alloy with a lower etching rate than copper exceeds 50 wt%.

4. The method of forming an electronic circuit according to claim 3, wherein the nickel amount is 100 μg/dm$^2$ to 3000 μg/dm$^2$.

5. The method of forming an electronic circuit according to claim 4, wherein at least one of a chromium layer, a chromate layer, and a silane-treated layer is additionally formed on the nickel or nickel alloy layer.

6. The method of forming an electronic circuit according to claim 5, wherein the amount of chromium in the case of comprising the chromium layer or chromate later is 100 µg/dm$^2$ or less based on metal chromium conversion.

7. The method of forming an electronic circuit according to claim 6, wherein the amount of silane in the case of comprising the silane-treated layer is 20 µg/dm$^2$ or less based on silicon elemental conversion.

8. The method of forming an electronic circuit according to claim 1, wherein the nickel or nickel alloy layer with a low etching rate is a nickel alloy layer with a lower etching rate than copper, and wherein nickel in the nickel alloy layer exceeds 50 wt%.

9. The method of forming an electronic circuit according to claim 1, wherein the nickel or nickel alloy layer is in an amount of 100 µg/dm$^2$ to 3000 µg/dm$^2$.

10. The method of forming an electronic circuit according to claim 1, wherein at least one of a chromium layer, a chromate layer, and a silane-treated layer is formed on the nickel or nickel alloy layer.

11. The method of forming an electronic circuit according to claim 1, wherein a chromium layer or a chromate layer is formed on the nickel or nickel alloy layer, and wherein an amount of chromium in the chromium layer or chromate layer is 100 µg/dm$^2$ or less based on metal chromium conversion.

12. The method of forming an electronic circuit according to claim 11, wherein a silane-treated layer is formed on the nickel or nickel alloy layer, and wherein an amount of silane in the silane-treated layer is 20 µg/dm$^2$ or less based on silicon elemental conversion.

13. The method of forming an electronic circuit according to claim 1, wherein a silane-treated layer is formed on the nickel or nickel alloy layer, and wherein an amount of silane in the silane-treated layer is 20 µg/dm$^2$ or less based on silicon elemental conversion.

* * * * *

UNITED STATES PATENT AND TRADEMARK OFFICE
CERTIFICATE OF CORRECTION

PATENT NO. : 8,357,307 B2
APPLICATION NO. : 13/141753
DATED : January 22, 2013
INVENTOR(S) : Keisuke Yamanishi et al.

It is certified that error appears in the above-identified patent and that said Letters Patent is hereby corrected as shown below:

Column 2, line 40 "fanning" should read "forming"

Column 4, line 1 "100 µ/dm2" should read "100 µg/dm2"

Signed and Sealed this
Second Day of April, 2013

Teresa Stanek Rea
*Acting Director of the United States Patent and Trademark Office*